United States Patent [19]

Neugroschel et al.

[11] Patent Number: 4,483,063

[45] Date of Patent: Nov. 20, 1984

[54] OXIDE CHARGE INDUCED HIGH LOW JUNCTION EMITTER SOLAR CELL

[75] Inventors: Arnost Neugroschel; Shing-Chong Pao; Fred A. Lindholm; Jerry G. Fossum, all of Gainesville, Fla.; Chih-Tang Sah, Urbana, Ill.

[73] Assignee: University of Florida, Gainesville, Fla.

[21] Appl. No.: 383,617

[22] Filed: Jun. 1, 1982

Related U.S. Application Data

[60] Division of Ser. No. 230,682, Feb. 2, 1981, Pat. No. 4,343,962, which is a continuation of Ser. No. 57,648, Jul. 16, 1979, abandoned.

[51] Int. Cl.³ .................... H01L 31/18; H01L 31/06
[52] U.S. Cl. ............................... 29/572; 29/589; 148/189
[58] Field of Search .................. 136/255; 29/572, 589, 29/591; 148/187, 189; 357/30

[56] References Cited

U.S. PATENT DOCUMENTS 4,144,094  3/1979  Coleman et al. ............... 136/255 X

OTHER PUBLICATIONS

Neugroschel, A. et al., "Emitter Current Suppression . . . Accumulation Layer" in *Appl. Phys. Lett.* 33 (2), Jul. 15, 1978.

*Primary Examiner*—Brian E. Hearn
*Assistant Examiner*—Alan E. Schiavelli
*Attorney, Agent, or Firm*—Arthur G. Yeager

[57] ABSTRACT

A method of forming a high-low junction emitter silicon solar cell including the producing of an electron accumulation layer by oxide-charge-induction.

2 Claims, 3 Drawing Figures

OXIDE CHARGE INDUCED HIGH LOW JUNCTION EMITTER SOLAR CELL

This application is a division of application Ser. No. 230,682, filed Feb. 2, 1981, now U.S. Pat. No. 4,343,962, which was a continuation of Ser. No. 057,648, filed on July 16, 1979, now abandoned.

THE INVENTION

The invention relates to a novel method of producing an improved high-low junction silicon solar cell.

BACKGROUND OF THE INVENTION

As Brandhorst first noted, (H. W. Brandhorst, Jr., Record of 9th Photovoltaic Specialists Conf. (IEEE, New York, 1972), p. 1.) the power conversion efficiency $\eta$ seen in silicon p-n junction solar cells is considerably less than the maximum theoretical value of $\eta$ mainly because the open-circuit voltage $V_{oc}$ is smaller than simple p-n junction theory predicts. Experiments on n+-p silicon cells have shown that this discrepancy in $V_{oc}$ results from the dominance, in the nonilluminated (dark) cell, of the emitter recombination current $J_E$ over the base recombination current $J_B$. In cells having base doping concentrations of the order of $10^{17}$ cm$^{-3}$, for which the largest values of $V_{oc}$ are seen, $J_E$ exceeds $J_B$ by about an order of magnitude, rather than being several orders of magnitude less than $J_B$ as is predicted by simple p-n junction theory. (F. A. Lindholm, A. Neugroschel, C. T. Sah, M. P. Goodlewski, and H. W. Brandhorst, Jr., IEEE Trans. Electron Devices ED-24, 402 (1977). The excess $J_E$ has been attributed to the mechanisms of energy band-gap narrowing and lifetime degradation that accompany heavy doping concentrations in the n+ emitter. (F. A. Lindholm and C. T. Sah, IEEE Trans. Electron. Devices ED-24, 299 (1977); C. T. Sah and F. A. Lindholm, IEEE Trans. Electron Devices ED-24, 358 (1977).

To supress $J_E$ and thus raise the achievable value of $V_{oc}$, a new structure, the HLE junction solar cell, containing a high-how (H-L) junction in the emitter, has been proposed and its performance has been calculated on theoretical grounds. (C. T. Sah, F. A. Lindholm, and J. G. Fossum, IEEE Trans. Electron Devices ED-25, 66 (1978); J. G. Fossum, F. A. Lindholm, and C. T. Sah, Tech. Digest 1977 Int. Electron Devices Mtg. (IEEE, New York, 1977), U.S. patent application Ser. No. 966,360, filed Dec. 4, 1978, Lindholm, Fossum and Sah.)

OBJECTS OF THE INVENTION

It is an object of this invention to provide an improved method of producing an H-L junction in the emitter in a silicon solar cell.

A particular object of the invention is to provide a method by which an electron accumulation layer is induced in the emitter of an n+-p silicon solar cell to create an H-L junction by induction of an oxide charge.

A general object of the invention is to provide in a silicon solar cell substantially complete suppression of the emitter recombination current $J_E$ and to maximize $V_{oc}$.

BRIEF DESCRIPTION OF THE DRAWINGS

The novel features which are believed to be characteristic of this invention are set forth with particularity in the appended claims. The invention itself, however, both as to its organization and method of operation, together with further objects and advantages thereof, may best be understood by reference to the following description taken in connection with the accompanying drawing, in which:

DETAILED DESCRIPTION OF THE INVENTION

Figure 1:
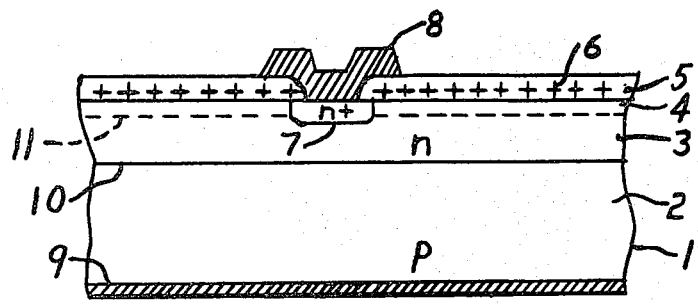
FIG. 1 is a cross-sectional fragmentary schematic view of an OCI-HLE solar cell made in accord with the novel method of this invention.

Referring to the drawings, FIG. 1 shows a n+-n-p OCI-HLE solar cell 1 which, according to the invention, comprises a p-type substrate 2, an n-type emitter comprising a low region 3 and a high electron accumulation region 4, an oxide layer 5 on the illumination surface, positive oxide charge 6, shallow n+ contact diffusion 7, such diffusion underlying each of the one or more aluminum or the like emitter contacts 8, and an ohmic contact 9 for the p region. A p-n junction 10 exists between the emitter region 3 and the substrate region 2, and a high-how junction 11 has been formed between the emitter regions 3 and 4.

Figure 2:
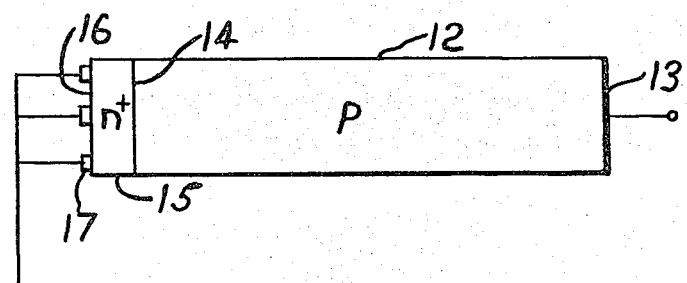
FIGS. 2 and 3 are schematic views similar to FIG. 1 of prior art solar cells.

The conventional n+-p cell of FIG. 2 comprises p-type substrate region 12 with an ohmic contact 13, a p-n junction 14, an n+-type diffused emitter 15 having an exposed, or antireflective layer coated, illuminatable surface 16 carrying aluminum or the like emitter contacts 17.

Figure 3:
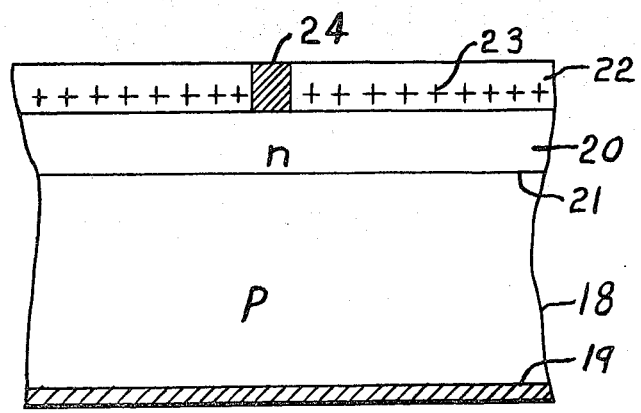

FIG. 3 shows another prior art cell which comprises p-type substrate 18 with an ohmic contact 19, n-type emitter 20, p-n junction 21, layer 22 containing charges 23, and metal contacts 24.

While the emitter of the conventional cell is typically heavily doped (i.e. to about $10^{20}$ cm$^{-3}$), the emitter of the present invention is preferably less heavily doped to less than about $10^{17}$ cm$^{-3}$, and preferably in the range of about $5 \times 10^{15}$ to about $8 \times 10^{16}$.

A heavily doped front layer, or emitter region, phosphorous or arsenic being common dopants has the disadvantage that the dark emitter recombination is so large that it limits the open-circuit voltage to about 600 mV maximum. This is well below the approximately 700 mV maximum that would result if the dark emitter recombination current were suppressed.

The structure of the invention—the oxide-charge-induced high-low-junction emitter (OCI-HLE) solar cell—suppresses the dark emitter recombination current and enhances the short-circuit current, and thus enables the achievement of larger open-circuit voltages and power conversion efficiencies than heretofore possible.

An illustration and discussion of the electron and hole concentrations, an energy band diagram, and other features and characteristics of HLE solar cells, applicable to OCI-HLE solar cells formed in accord with this invention, are included in the above mentioned U.S. application Ser. No. 966,360, in connection with FIG. 3 thereof. In addition to the increase of the open-circuit voltage $V_{oc}$ there noted, the low hole surface recombination velocity Sp will result in only a negligible recombination of optically generated minority holes in the emitter at the surface, which result in collection of almost all holes by a p-n junction 11.

An aluminum or the like metal contact 8 is in ohmic contact with the emitter and a shallow n+ diffusion 7 is made under this metalized portion of the top surface area. The ohmic contact 8 should cover no more than about 5 to 10% of the surface area. The $n^{30}$ diffusion 7 also provides a high-low barrier with a small effective surface recombination velocity for holes. The induced accumulation layer 4 extends several Debye lengths from the surface and can be as thin as 100 Å.

The high portion 4 of the high-low junction is thin and the lifetime in the low-portion can be made long because of the low doping concentration present in this portion. Consequently the transit time of holes across the emitter region to the surface 5 is much less than the effective recombination lifetime in the bulk of the emitter. The lower portion 3 of the high-low junction also serves to provide a large enough value of lateral sheet conductance that the lateral component of the series resistance can be made small enough to avoid degradation of the power conversion efficiency. The HLE solar cell is useful both for one-sun and multiple-sun applications.

A prior art cell disclosed in U.S. Pat. No. 4,144,094, which as disclosed seems to have some similarities to the OCI-HLE cell of the present invention is shown in FIG. 3. The FIG. 3 cell, however, does not provide an $n^+$ contact diffusion underneath the metal contact 24. Since the recombination velocity at the silicon-metal interface is very large and the doping in the low portion of the emitter 20 is low, the hole recombination current under the metalized portion of the surface 24 will be very large. Also holes within distance about equal to the hole diffusion from both sides of metal contact 24 will recombine under it with large Sp. As a result the open-circuit voltage of the prior art cell of FIG. 3 will be limited to about 600 mV. Therefore a cell from FIG. 3 would not represent an improvement of a conventional $n^+$-p cell with diffused emitter from FIG. 2.

The problem of high Sp under the metal is solved in the present OCI-HLE structure by a shallow $n^+$ diffusion 7 which reduces high Sp under the metal to the much smaller value at the $n^+$-n interface.

An HLE cell in accord with the invention may be formed from commercially available eqitaxial silicon wafer material, or from less costly diffused or ion implanted material, the silicon being crystalline, either mono- or polycrystalline, or from other semiconductor solar cell n-p materials. The OCI-HLE junction is then formed by introducing charges into the layer 5 covering the top surface. Most convenient realization of this is to use a thermal silicon dioxide layer treated in dry oxygen at temperatures between 600° to 800° C. which treatment will result in the presence of a positive charge at the surface. This silicon dioxide layer will also serve as an antireflection coating. Surface layer 5 with a positive charge can be also realized using doped oxides, thermal plus evaporated or deposited oxides, thermal oxides plus nitrides, or using other oxides, such as Cr and Ti oxides, and others.

Several runs of test cells have been made that demonstrate the desired suppression of the magnitude of the dark emitter current. In one such run, the starting material consisted of a 10 μm thick n-type layer of resistivity $\rho_{epi} \approx 0.1$ Ωcm grown epitaxially on a p-type substrate of 300 μm thickness and resistivity $\rho_{base} \approx 0.1$ Ωcm.

The substrate Z may have a resistivity of between about $\rho = 0.1$ to 0.01 Ωcm, being doped to between about $1 \times 10^{19}$ and $5 \times 10^{17}$ cm$^{-3}$. The resistivity of the emitter may range from about 0.1 to 1.0 Ωcm., the thickness of the emitter 3 may be between about 10 and 50 μm, and the depth of the contact diffusion 7 may be between about 0.25 and 0.75 μm.

To fabricate OCI-HLE test cells according to the preferred embodiment, the wafer was oxidized for approximately 2 to 5 hours in dry $O_2$ with 0.3% trichloroethylene, at from 1100° C. to 1150° C., to grow a 2500Å thick oxide layer, which was later etched to 1100Å to improve the antireflection properties. The temperature of 1100° C. to 1150° C. was chosen for this test cell to assure a good-quality oxide and a low value of Sp. After oxidation the wafer was cooled from 1100° C. to 1000° C. at the rate of 30° C. per hour and then cooled to 700° C. in three hours.

Openings through the oxide layer for the contact 8 are next provided by etching, the openings having an area equal to about 5 to 10% of the total oxide surface area. The wafer was then subjected to heating at 900° C. for 20 minutes in the phosphorous diffusion furnace to provide the $n^+$ contact diffusion or diffusions 7 in the layer 3 at each of the etched openings. The device was next heated in dry oxygen for from 2 to 12 hours at 700° C. to increase the oxide charge density $Q_o$.

The wafer is now provided with an emitter contact 8 at each opening in the oxide layer 5. Aluminum is evaporated onto the wafer surface, and a photolighographic pattern is applied permitting etching of the aluminum to leave the desired aluminum contacts 8, with their underlying contact diffusions 7, and an appropriate network of interconnections for such contacts. Alternatively, a thin film of titanium may be evaporated on the surface, followed by a film of silver, the total thickness of such titanium-silver coating being, for example, 1 μm. Such film is etched in the same manner as described above.

Finally, the cell is annealed at about 400° C. for about 20 minutes in a forming gas, for example 10% $H_2$, 90% $N_2$.

According to the invention there is thus provided in a solar cell, suppression of dark emitter current, and increase of short circuit current, without untenable series resistance, by the high-low junction 11 in the emitter 3 together with low surface recombination velocity on the nonmetallized portion of the illuminated emitter surface.

Further details of the invention are disclosed in the Applied Physics Letters, Vol. 33, pp 168-170, July 15, 1978, under the title "Emitter Current Suppression In A High-Low-Junction Emitter Solar Cell Using An Oxide-Charge-Induced Electron Accumulation Layer", by A. Neugroschel, F. A. Lindholm, S. C. Pao, and J. G. Fossum.

Further background and details of the invention are also set forth in the publications referenced in the specification of the above identified application Ser. No. 966,360.

What is claimed and desired to be secured by U.S. Letters Patent is:

1. In a method of making a high-low junction emitter n-p solar cell which comprises providing a wafer including an n-type emitter and a p-type substrate, maintaining said wafer at an elevated temperature in an atmosphere consisting essentially of oxygen to form an oxide layer on said emitter, forming an opening in said layer, providing an $n^+$ diffusion under said opening, maintaining the wafer at a lower elevated temperature in dry oxygen to increase the oxide charge density, and applying a conductive material in said opening in contact with said $n^+$ diffusion.

2. The method of making a high-low junction emitter n-p solar cell comprising providing a silicon wafer having an n emitter and having a p substrate provided with an ohmic surface contact, maintaining said wafer in an oxidizing atmosphere at between about 1100° C. and 1150° C. for between about 2 and 12 hours, slowly cooling the wafer, providing an opening through the resultant oxide layer, maintaining the wafer at approximately 900° C. in presence of phosphorous or n-type impurities for approximately 20 minutes to produce an $n^+$ diffusion under said opening, maintaining said wafer at between about 600° and 800° C. in dry oxygen for about 2 hours, and applying a conductive contact in contact in with $n^+$ diffusion.

* * * * *